(12) United States Patent
Wang et al.

(10) Patent No.: US 6,291,281 B1
(45) Date of Patent: Sep. 18, 2001

(54) METHOD OF FABRICATING PROTECTION STRUCTURE

(75) Inventors: Mu-Chun Wang, Hsinchu Hsien; Tzung-Han Lee, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/406,356

(22) Filed: Sep. 28, 1999

(51) Int. Cl.[7] ............................................. H01L 21/8238
(52) U.S. Cl. .................... 438/200; 438/197; 438/237; 438/238
(58) Field of Search .................................. 438/200, 237, 438/238, 197

(56) References Cited

U.S. PATENT DOCUMENTS 6,048,761 * 4/2000 En ........................................ 438/237

OTHER PUBLICATIONS

H. Shin et al., "Impact of Plasma Charging damage and Diode Protection on Scaled Thin Oxide", International Electron Devices Meeting 1993, IEEE Cat. No. 93CH3361–03, 1993, pp. 467–470.*

* cited by examiner

Primary Examiner—Charles Bowers
Assistant Examiner—Asok Kumar Sarkar
(74) Attorney, Agent, or Firm—Thomas, Kayden, Horstemeyer & Risley, LLP

(57) ABSTRACT

A method of fabricating a protection device. A contact resistor, or a protection diode and a contact resistor are formed in a substrate. The protection diode and the contact resistor are electrically connected to a gate of a MOS so as to protect the MOS from being damaged by plasma. A multi-level interconnect is formed on the substrate, while a top metal layer of the multi-level interconnect is patterned, the electrical connection between the gate and the protection device is broken.

15 Claims, 5 Drawing Sheets

METHOD OF FABRICATING PROTECTION STRUCTURE

BACKGROUND OF THE INVENTION

1. Field of the Invention

The invention relates in general to a method of fabricating a protection structure. More particularly, the invention relates to a method of fabricating a protection structure which can be used to protect both a PMOS and an NMOS.

2. Description of the Related Art

In an integrated circuit, after the formation of certain devices, there are still some processes to be performed to complete the circuit layout. For example, after a PMOS or an NMOS is formed on a substrate, to obtain an electrical connection between PMOS or NMOS and other devices or terminals, a conductive layer is formed and patterned. While patterning the conductive layer, an etching step is inevitable. The plasma or other charged particles used to etch the conductive layer very often damage the NMOS or PMOS formed on the substrate. To protect the PMOS or NMOS from being damaged by the accumulated charged particles or carriers, a protection diode (PD) is formed in prior fabrication technology. Typically, for an NMOS, an N+/P− diode is formed to direct negative charges to the ground. In contrast, for a PMOS, a P+/N− diode is formed to dissipate the positive charges.

FIG. 1A and FIG. 1B respectively show circuit diagrams of protection diodes used for NMOS and PMOS. As shown in the figures, since the polarity of protection diodes required by the NMOS and the PMOS are different, if one is to fabricate a single protection diode in one substrate having both PMOS and NMOS, the conventional technique cannot achieve the objective.

Furthermore, after the formation of the devices in and on the substrate, a multi-level interconnect is typically formed on the devices to complete the circuit layout. The electrical connection between the gate and the protection diode very often degrades the performance and electrical characteristics of the circuit.

SUMMARY OF THE INVENTION

The invention provides a method of fabricating a protection structure. The protection structure comprises a contact resistor, or a combination of a contact resistor and a protection diode. The protection structure can protect both an NMOS and a PMOS from plasma damage without interchanging the polarity thereof. Furthermore, in the invention, after a top metal layer of an interconnect of the integrated circuit is formed and patterned, the electrical connection between the gate of the devices such as an NMOS or a PMOS and the protection structure is open, so that the circuit performance is enhanced. Therefore, in an early stage of the fabrication process, the devices, including the NMOS, PMOS, or even gate oxides of the devices can be protected from plasma damage by connecting the gate with the protection structure. While the circuit layout is complete, the connection between the gate and the protection structure is open to obtain an improved performance of the circuit.

In the fabricating method of the invention, a substrate of a first conductive type is provided. The substrate comprises at least a gate oxide layer thereon, and a gate formed on the gate oxide layer. A first heavily doped region of a first conductive type and a second heavily doped region of a second conductive type are formed in the substrate without any physically mutual connection. Or alternatively, only one heavily doped region of the first conductive type is formed. An inter-layer dielectric layer (ILD) is formed on the substrate to cover the first and second heavily doped regions, the gate and the substrate. Plugs are formed to penetrate through the dielectric layer to couple the gate, the first and the second heavily doped regions. A first metal layer is formed on the inter-layer dielectric layer to couple with the contact resistor, the protection diode and the gate. A first inter-metal dielectric layer is formed on the metal layer. The first inter-metal dielectric layer is etched to form first via holes or contact window openings. Among the first openings, there is one opening exposing the first metal layer. A glue layer is formed on the inter-metal dielectric layer and on a surface of the openings. It is to be noted that for those openings with sizes small enough, the first inter-metal dielectric layer will fill the spaces of the openings. In contrast, for those openings with larger sizes, the glue layer is formed to cover inner surfaces of the opening conformally. In the invention, the opening exposing the first metal layer is big enough so that the glue layer is formed to cover the opening conformally without filling the opening. A chemical mechanical polishing step is performed to remove the inter-metal dielectric layer on the inter-layer dielectric layer, and the glue layer on the inner surfaces of the openings with larger sizes. A second inter-metal layer is formed on the first inter-metal layer and to fill the first openings. The second inter-metal layer is etched to form second via holes or contact window openings. Among the second openings, there is one opening exposing the first metal layer. A glue layer is formed on the second inter-metal dielectric layer and to cover a surface of the opening exposing the first metal. A second metal layer is formed and patterned on the second inter-metal dielectric layer. An over etching step is performed until the first metal layer exposed by the opening is removed. Therefore, the electrical connection between the gate and the protection structure is open and the electrical performance of the circuit is enhanced.

Both the foregoing general description and the following detailed description are exemplary and explanatory only and are not restrictive of the invention, as claimed.

DESCRIPTION OF THE PREFERRED EMBODIMENTS

To provide a clear illustration of the invention, FIG. 3A to FIG. 3F are cross sectional views showing the fabrication process of a protection device. In this embodiment, an NMOS device is used as an example. It is to be noted that the invention can also be applied to other devices, such as a PMOS.

Figure 1A:
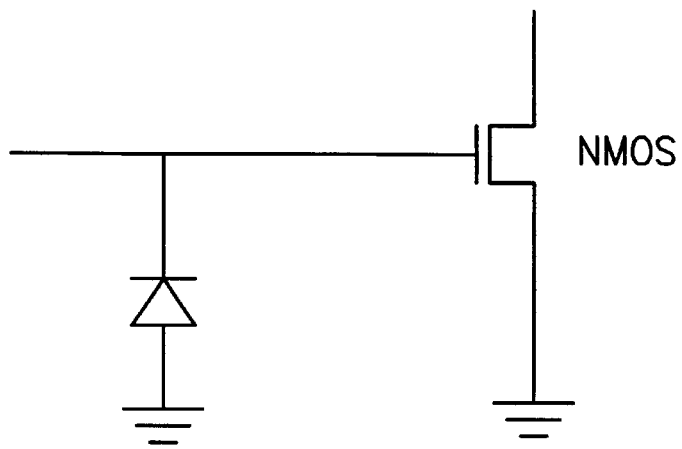
FIG. 1A and FIG. 1B show circuit diagrams of a conventional protection diode.
Figure 1B:
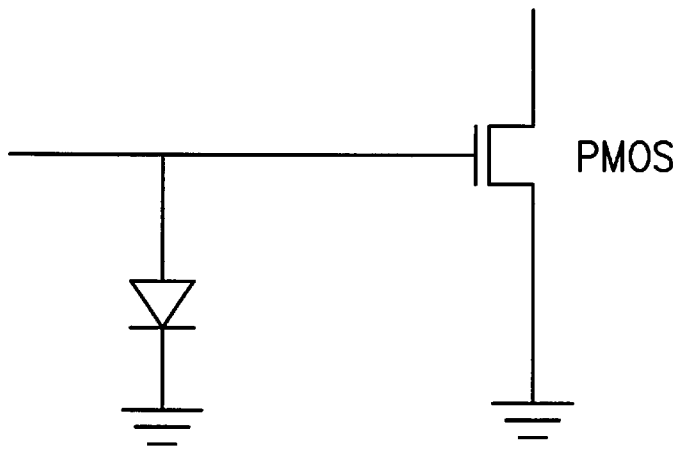
Figure 2:
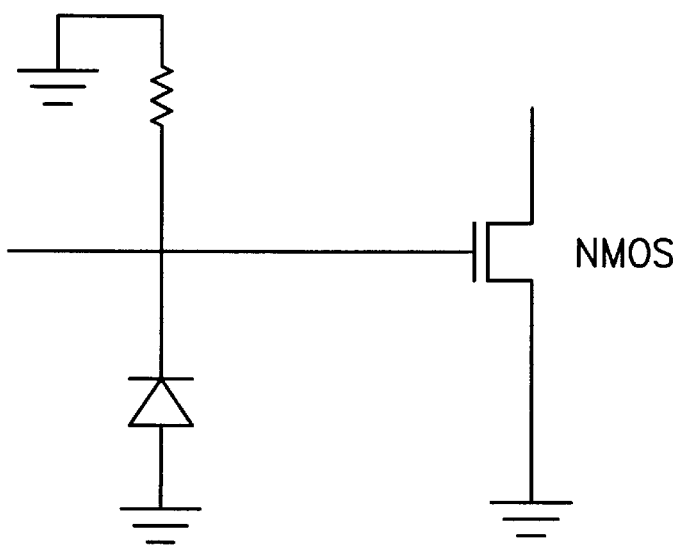
FIG. 2 shows a circuit diagram of a protection structure according to the invention.
Figure 3A:
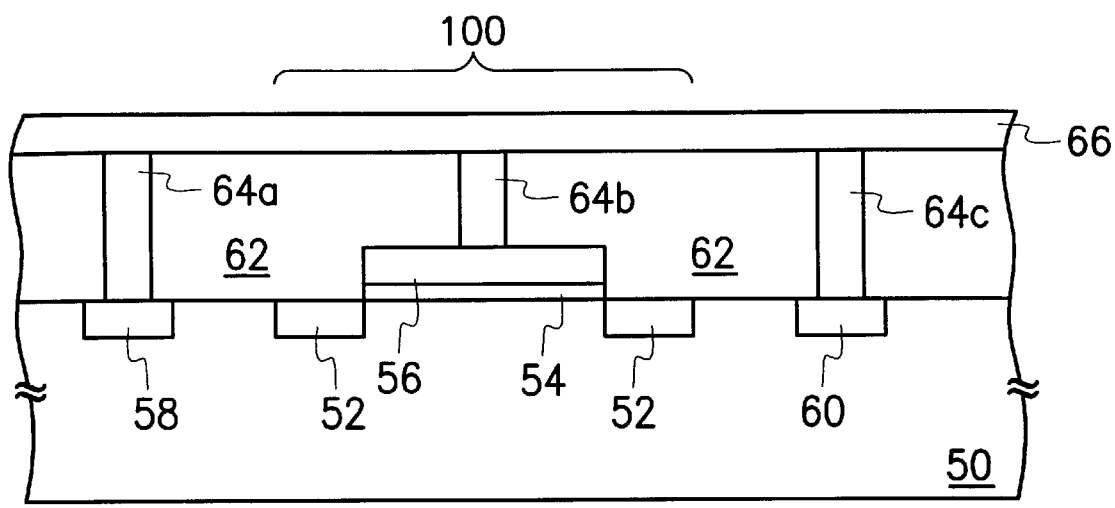
FIG. 3A to FIG. 3F shows the fabrication process of the protection structure and circuit shown in FIG. 2.

Referring to FIG. 3A, a P type substrate 50 is provided. The P type substrate 50 comprises a heavily doped source/drain region 52, a gate oxide layer 54 on the substrate 50 between the source/drain region 52 and a gate 56 on the gate oxide 54. The substrate 50 also has an N type heavily doped region 58 therein, which will be referred to as an N+ region 58 hereinafter. The P type substrate 50 and the N+ region 58 thus form a protection N+/P− diode to protect the NMOS 100, which includes the source/drain region 52, the gate 56 and the gate oxide layer 54. In addition, a P type heavily doped region 60, referred to as P+ region 60 hereinafter, is formed in the substrate 50 without any physical contact with the source/drain region 52 and the N+ region 58. The P+ region 60 and the adjacent portion of the P type substrate 50 thus form a P+/P− contact resistor to provide further protection for the NMOS 100. With the formation of the P+/P− contact resistor, regardless of whether the plasma contains positive or negative charges or carriers, these carriers can be dissipated or neutralized without accumulating to damage the NMOS 100. In a typical circuit design, the N+/P− diode and the P+/P− contact resistor are to be electrically connected to the gate 56. As shown in FIG. 3A, an inter-layer dielectric layer 62 is formed to isolate any unwanted connection over the substrate 50. The inter-layer dielectric layer 62 is etched to form at least openings 64a, 64b and 64c to couple with the N+/P− diode, the gate 56 and the contact resistor 60. A metal layer 66 is formed for the circuit layout. That is, as shown in FIG. 3A, the metal layer 66 is formed to electrically connect with the gate 56 of the MOS 100, the N+/P− diode and the P+/P− contact resistor. Therefore, in the subsequent plasma or other processes, those carriers damaging to the NMOS 100, especially to the gate oxide layer 54, can be directed to the substrate 50 via the N+/P− diode and the P+/P− to be grounded. Thus, the plasma damage caused in the conventional fabrication process is eliminated.

Figure 3B:
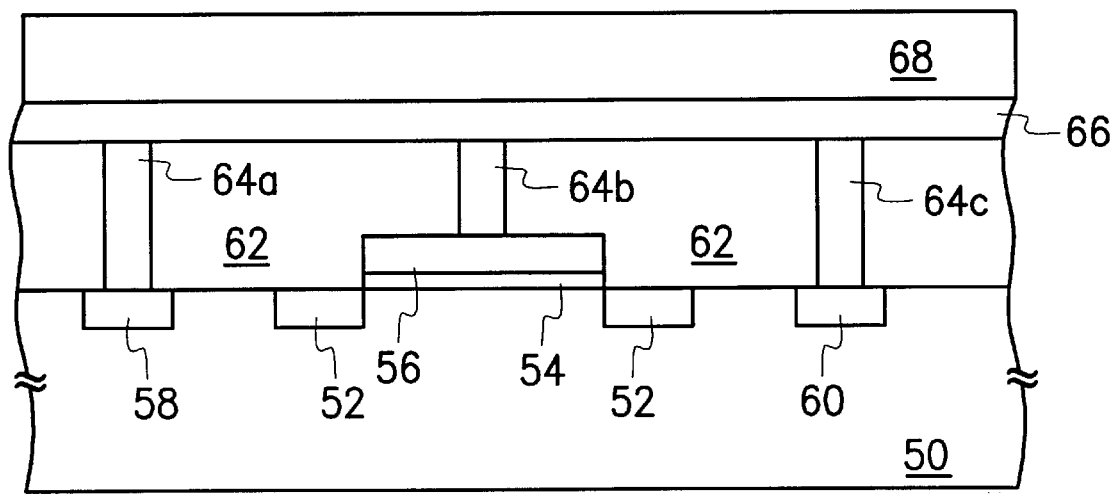
Figure 3C:
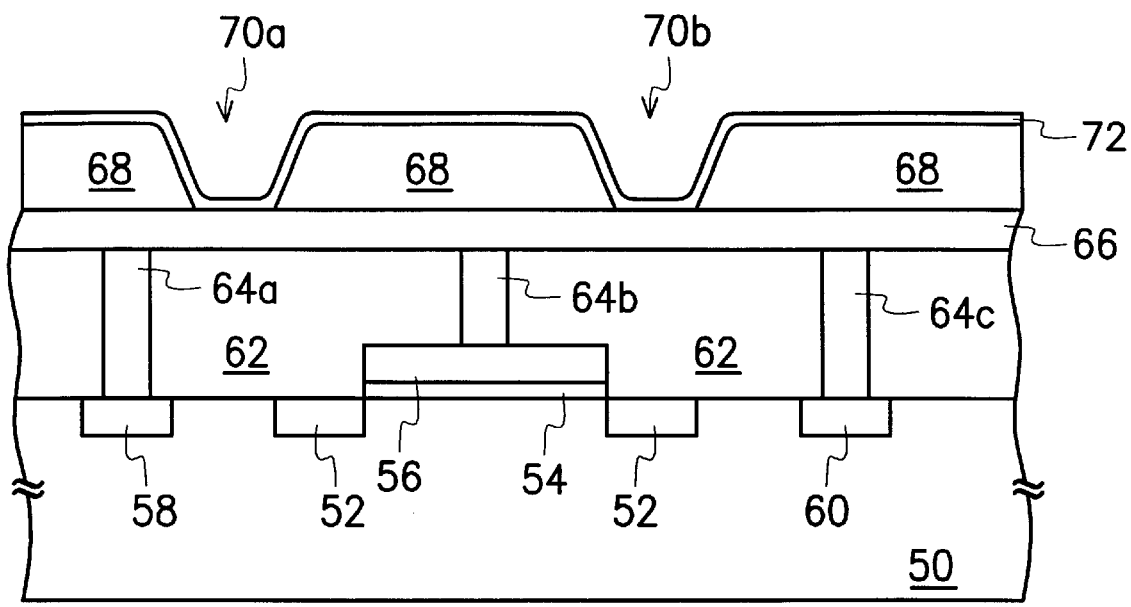

As the integration of integrated circuits becomes even greater, a single metal or conductive layer cannot complete a circuit layout for the integrated circuits. Thus, a multi-level interconnection of most of the integrated circuits is formed after the devices on a substrate are formed. Between the metal layers, an inter-metal dielectric layer (IMD) is formed for isolating the neighboring metal layers. In FIG. 3B, an inter-metal dielectric layer 68 is formed on the metal layer 66. Using a photolithography and etching step, portions of the inter-metal dielectric layer 68 are removed to form via holes or contact window openings to expose portions of the metal layer 66, for example, the openings 70a and 70b as shown in FIG. 3C. The openings 70a and 70b are formed with a size large enough so that during a subsequent etching or chemical mechanical polishing step, a glue layer 72 formed on the openings 70a and 70b are removed to expose the underlying metal layer 66. However, other small openings (not shown in the figure) may also be formed simultaneously with the openings 70a and 70b. If the glue layer 72 is formed on the inter-metal dielectric layer 68, these openings may be filled without being removed in the subsequent etching or chemical mechanical polishing step. The glue layer 72, for example, a tungsten layer, is formed on the inter-metal dielectric layer 68 and inner surfaces of the openings 70a and 70b. For those openings with smaller sizes, the glue layer 72 may fill the spaces of these openings. Since the glue layer 72 is typically thin, the glue layer 72 is conformal to the surface profile of the substrate 50, as shown in FIG. 3C.

Figure 3D:
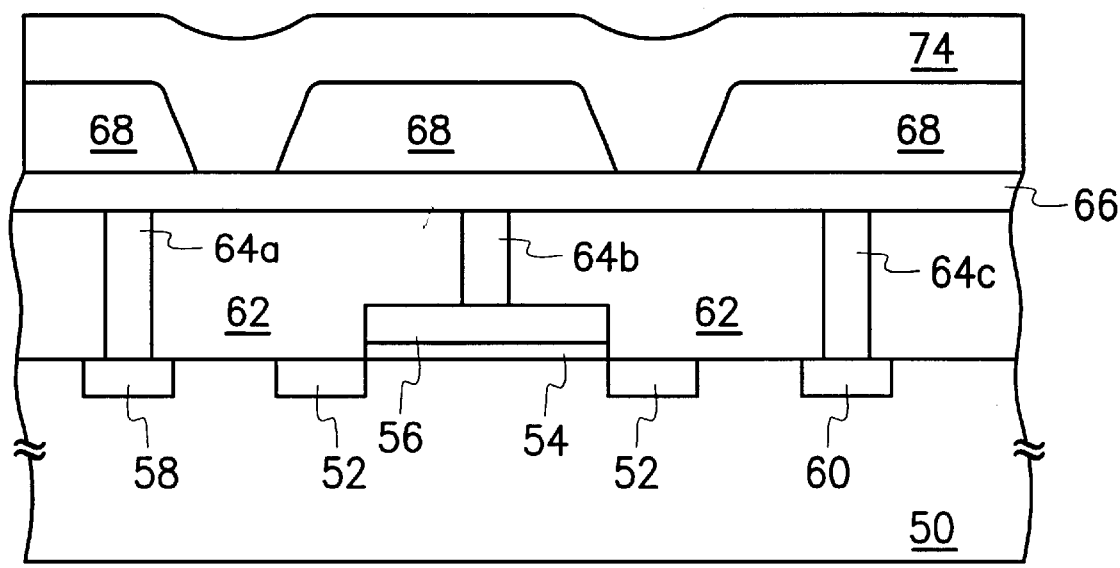

In FIG. 3D, an etching step of a chemical mechanical polishing step is performed to remove the glue layer 72 on the inter-metal dielectric layer 68 and on the inner surfaces of the opening 70a and 70b to expose the first metal layer 66. As mentioned above, the glue layer 72 filing those openings with small sizes may remain as via or contact plugs after the step of etching or chemical mechanical polishing. An inter-metal dielectric layer 74 is further formed on the inter-metal dielectric layer 68 and to fill the openings, including the openings 70a and 70b.

Figure 3E:
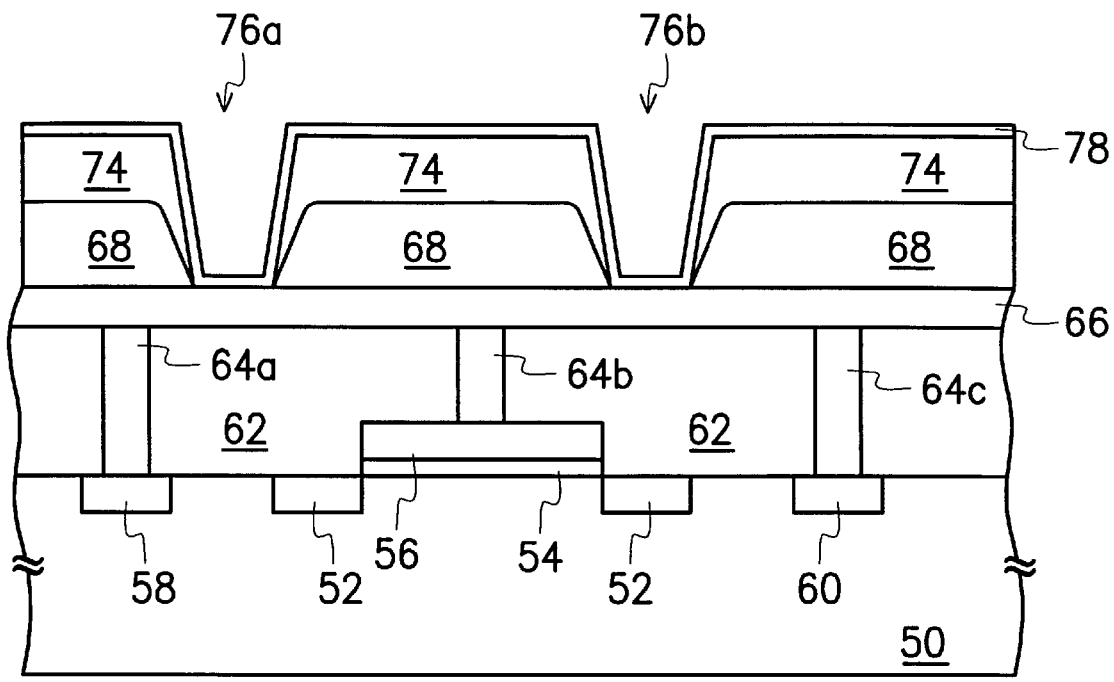
Figure 3F:
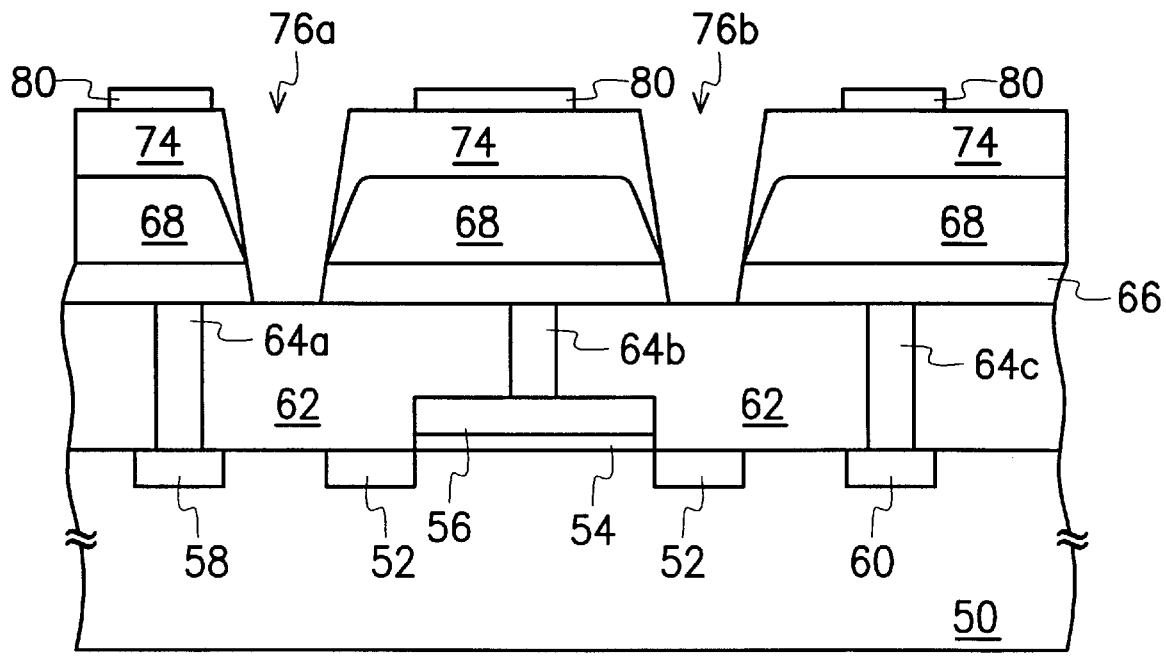

In FIG. 3E, the inter-metal dielectric layer 74 is etched to form openings with various sizes, including the openings 76a and 76b that again expose the metal layer 66. A glue layer 78 is formed on the inter-metal dielectric layer 74 and inner surfaces of the openings. Again, those openings with small sizes may be filled with the glue layer 78 to form a via/contact plug, while the openings 76a and 76b are large enough so that the glue layer 78 is formed along the inner surface profile without filling the openings 76a and 76b. In FIG. 3F, a metal layer 80, which is a top metal layer for the interconnection of the circuit on the substrate 50 in this embodiment, is formed and patterned on the inter-metal dielectric layer 74. An over etching step is performed until the glue layer 78 is uncovered by the patterned metal layer and the metal layer 66 underlying the openings 76a and 76b is removed. As a result, the electrical connection between the gate 56 to the N+/P− diode and the P+/P− contact resistor is open.

In the earlier stage of the fabrication process, while the NMOS 100 is exposed under a plasma environment or other environment with charged carriers, plasma damage is caused. With the formation of the protection structure, that is, the N+/P− diode and the P+/P− contact resistor electrically connecting with the gate 56 of the NMOS 100, the NMOS 100 is thus protected from being damaged by the plasma or charged particles or carriers. However, the connection between the gate 56 and the protection structure causes degradation, such as inducing parasitic capacitance which thus affects the circuit performance. Therefore, in the invention, after the top metal layer is formed and patterned, the metal layer 66 that connects the gate 56 and the protection structure is partly removed to eliminate the electrical connection.

Thus, in addition to providing a protection method of the devices from being damaged by plasma, after the fulfillment of the protection function, the invention further provides a method to break the connection between the device and the protection structure to enhance the circuit characteristics and performance.

Figure 4:
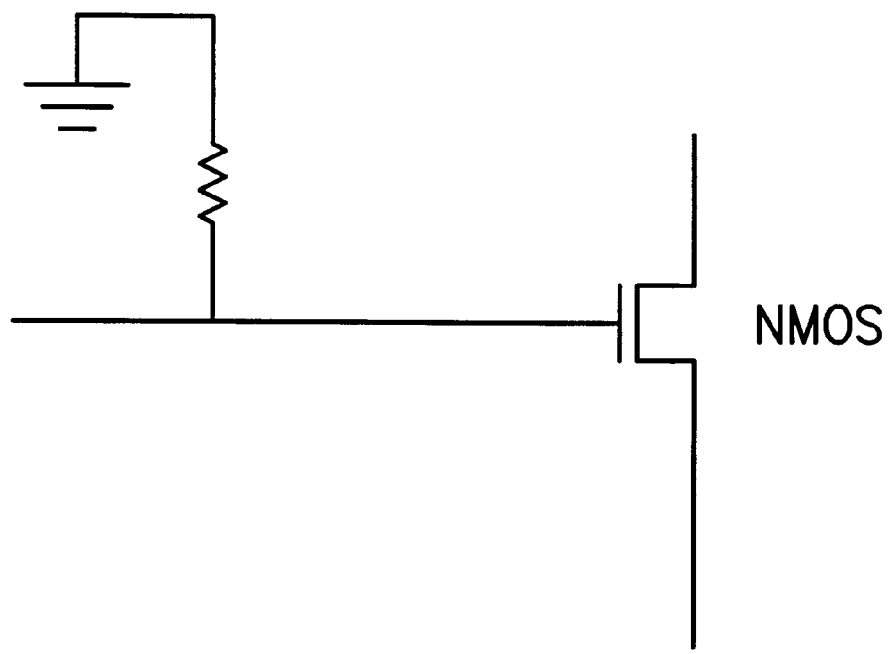
FIG. 4 shows a circuit diagram of a protection structure in another example according to the invention.

The invention also includes a method for fabricating only a contact resistor as the protection structure without the formation of a protection diode, and the circuit diagram is shown in FIG. 4. The same effect may also be achieved. Furthermore, as mentioned above, the invention can also be applied to the protection of a PMOS instead of an NMOS described as above. Furthermore, the invention provides a method for fabricating a protection device of an integrated circuit with a multi-level interconnect formed of two metal layers. It is appreciated that the invention may also be applied to those devices or circuits comprising different metal layers.

Figure 5:
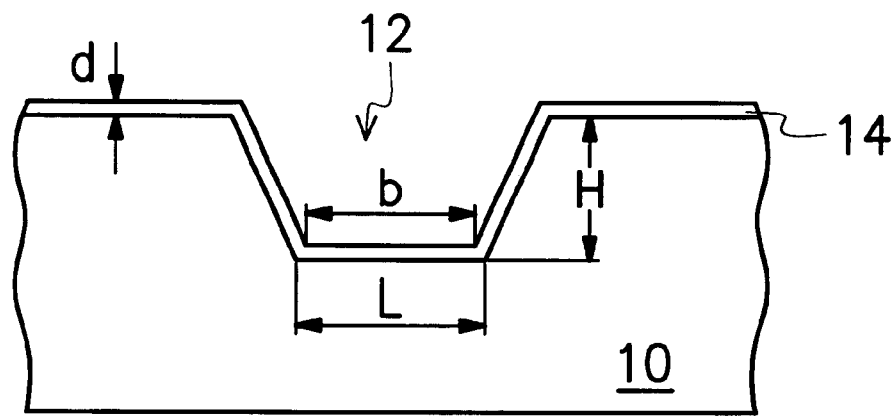
FIG. 5 shows the relationship between a via hole or contact window opening, inter-metal dielectric layer and glue layer.

An etching effect of the glue layer such as a thin tungsten layer formed in the via hole or contact window openings is further disclosed and shown as FIG. 5. An an-isotropic etching step is used, for example. An opening 12 is formed in an inter-metal dielectric layer 10. The depth of the opening 12 is H, and the width of the inner bottom surface of the opening 12 is b. The width of the outer bottom surface of the opening 12 is L. The glue layer formed on the surface of the opening 12 has a thickness of d. To ensure that the glue metal layer is well etched, an over etching step is typically performed. Assuming the over etching rate is a %, and the substrate comprising n layers of inter-metal dielectric layers, a relationship is obtained as:

$$L = b + 2''(1-a\%)d$$

Assuming that b=0.5 micron and d=0.4 micron, using the above relationship, Table 1 shows the results of the relationships between the number of layers n and the outer width L of the opening.

Among the above parameters, the parameter b determines the opening filling performance for a passivation layer.

If both the isotropic and the an-isotropic etching techniques can be applied to etch tungsten, L can be reduced for the first inter-metal dielectric layer. While tungsten is etched by an isotropic etching step, L=2d+0.1 micron. After a top metal layer is formed, a wide enough space can be provided to isolate the protection diode and the contact resistor formed aside of the gate.

TABLE 1

| Number of Layers of IMD (n) | Minimum Outer Width of the Opening ($L_{min}$, micron) |
| --- | --- |
| 1 | 0.9 |
| 2 | 1.3 |
| 3 | 2.1 |
| 4 | 3.7 |
| 5 | 6.9 |

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a protection device, comprising:
   providing a substrate of a first conductive type, the substrate further comprising a gate thereon;
   forming a first heavily doped region of the first conductive type;
   forming a second heavily doped region of a second conductive type;
   forming a first dielectric layer on the substrate to cover the gate, the first and the second heavily doped regions, wherein the first dielectric layer having a plurality of plugs penetrating through the first dielectric layer and respectively coupled to the gate, the first and the second heavily doped region;
   forming a first metal layer on the first dielectric layer to couple the plugs, so as to electrically connect gate, the first and the second heavily doped regions;
   forming a second dielectric layer on the first metal layer, wherein the second dielectric layer comprising at least one first opening exposing a part of the first metal layer;
   forming a third dielectric layer on the second dielectric layer to fill the first opening, the third dielectric layer having at least one second opening to expose the part of the first metal layer;
   forming a glue layer on the third dielectric layer and a surface of the second opening;
   forming and patterning a second metal layer on the glue layer over the third dielectric layer; and
   performing an over etching step until the first metal layer underlying the second opening is removed.

2. The method according to claim 1, wherein first conductive type is P type and the second conductive type is N type.

3. The method according to claim 1, wherein the first conductive type is N type and the second conductive type is P type.

4. The method according to claim 1, further comprising the steps of:
   forming a first glue layer along a surface profile of the substrate before forming the third dielectric layer; and
   performing a chemical mechanical polishing step on the first glue layer.

5. The method according to claim 1, wherein the glue layer includes a tungsten layer.

6. A method of fabricating a protection device, comprising:
   providing a substrate of a first conductive type;
   forming a first heavily doped region of the first conductive type;
   forming a first dielectric layer on the substrate;
   forming a first metal layer on the first dielectric layer to establish an electrically connection between a device formed on the substrate and the first heavily doped region via plugs formed in the first dielectric layer;
   forming a second dielectric layer on the first metal layer with a first opening exposing a part of the metal layer;
   forming a third dielectric layer on the second dielectric layer with a second opening exposing the first metal layer;
   forming a glue layer on the third dielectric layer on the second dielectric layer and on a surface of the second opening;
   forming and patterning the second metal layer on the glue layer over the third dielectric layer; and
   performing an over etching step until the first metal layer underlying the second opening is removed.

7. The method according to claim 6, wherein the first conductive type is P type and the second conductive type is N type.

8. The method according to claim 6, wherein the first conductive type is N type and the second conductive type is P type.

9. The method according to claim 6, further comprising the steps of:
   forming the other glue layer along a surface profile of the substrate before forming the third dielectric layer; and
   performing a chemical mechanical polishing step on the other glue layer.

10. The method according to claim 6, wherein the glue layer includes a tungsten layer.

11. A method of forming a protection device, comprising:
    providing a substrate of a first conductive type, the substrate comprising a device thereon;
    forming a contact resistor in the substrate;
    forming a dielectric layer on the substrate;
    forming a bottom metal line within the dielectric layer to electrically connect the device on the substrate;
    forming a multi-level interconnect on the dielectric layer including forming and patterning a top metal layer; and
    performing an over etching step to eliminate the electric connection between the device and the contact resistor.

12. The method according to claim 11, wherein the first conductive type is P type.

13. The method according to claim 11, wherein the first conductive type is N type.

14. The method according to claim 11, wherein the multi-level interconnect further comprises a glue layer formed before forming the top metal layer.

15. The method according to claim 11, wherein the substrate further comprises a protection diode formed without physically contacting with the device and the contact resistor, and is electrically connected to the device via the first metal line.

* * * * *